US009856580B2

(12) United States Patent
Sanchez et al.

(10) Patent No.: US 9,856,580 B2
(45) Date of Patent: Jan. 2, 2018

(54) APPARATUS FOR IMPURITY LAYERED EPITAXY

(71) Applicant: Applied Materials, Inc., Santa Clara, CA (US)

(72) Inventors: Errol Antonio C. Sanchez, Tracy, CA (US); Swaminathan T. Srinivasan, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 579 days.

(21) Appl. No.: 14/444,640

(22) Filed: Jul. 28, 2014

(65) Prior Publication Data

US 2015/0047566 A1 Feb. 19, 2015

Related U.S. Application Data

(60) Provisional application No. 61/867,385, filed on Aug. 19, 2013.

(51) Int. Cl.
*C30B 25/08* (2006.01)
*C30B 25/14* (2006.01)
(Continued)

(52) U.S. Cl.
CPC .......... *C30B 25/08* (2013.01); *C30B 25/105* (2013.01); *C30B 25/12* (2013.01); *C30B 25/14* (2013.01);
(Continued)

(58) Field of Classification Search
CPC ......... C30B 25/08; C30B 29/36; C30B 29/06; C30B 29/52; C30B 25/12; C30B 25/14; C30B 25/105
(Continued)

(56) References Cited

U.S. PATENT DOCUMENTS 5,085,887 A * 2/1992 Adams .................. C23C 16/481
118/620
6,475,627 B1 * 11/2002 Ose .................. C23C 16/45561
257/E21.101
(Continued)

FOREIGN PATENT DOCUMENTS

| JP | 2007-005479 A | 1/2007 |
|---|---|---|
| KR | 10-0800377 B1 | 2/2008 |
| KR | 10-2010-004753 A | 5/2010 |

OTHER PUBLICATIONS

International Search Report and Written Opinion for International Application No. PCT/US2014/048506 dated Nov. 11, 2014.

*Primary Examiner* — Rudy Zervigon
(74) *Attorney, Agent, or Firm* — Patterson + Sheridan LLP

(57) ABSTRACT

Embodiments of the disclosure relate to an apparatus for processing a semiconductor substrate. The apparatus includes a process chamber having a substrate support for supporting a substrate, a lower dome and an upper dome opposing the lower dome, a plurality of gas injects disposed within a sidewall of the process chamber. The apparatus includes a gas delivery system coupled to the process chamber via the plurality of gas injects, the gas delivery system includes a gas conduit providing one or more chemical species to the plurality of gas injects via a first fluid line, a dopant source providing one or more dopants to the plurality of gas injects via a second fluid line, and a fast switching valve disposed between the second fluid line and the process chamber, wherein the fast switching valve switches flowing of the one or more dopants between the process chamber and an exhaust.

9 Claims, 3 Drawing Sheets

(51) Int. Cl.
  *C30B 25/12* (2006.01)
  *C30B 25/10* (2006.01)
  *C30B 29/06* (2006.01)
  *C30B 29/36* (2006.01)
  *C30B 29/52* (2006.01)

(52) U.S. Cl.
  CPC .............. *C30B 29/06* (2013.01); *C30B 29/36* (2013.01); *C30B 29/52* (2013.01)

(58) Field of Classification Search
  USPC ........................................ 118/715; 156/345.1
  See application file for complete search history.

(56) References Cited

U.S. PATENT DOCUMENTS

| | | | | |
|---|---|---|---|---|
| 6,927,140 | B2* | 8/2005 | Soman | H01L 21/02381 257/E21.106 |
| 7,537,662 | B2* | 5/2009 | Soininen | C23C 16/4412 118/715 |
| 7,708,859 | B2 | 5/2010 | Huang et al. | |
| 8,058,170 | B2* | 11/2011 | Chandrashekar | C23C 16/0281 257/E21.575 |
| 8,623,456 | B2* | 1/2014 | Yoon | C23C 16/45551 427/255.23 |
| 8,623,733 | B2* | 1/2014 | Chen | C23C 16/0272 118/719 |
| 8,834,631 | B2* | 9/2014 | Hirose | H03K 21/023 118/699 |
| 9,512,520 | B2* | 12/2016 | Sanchez | C23C 16/4412 |
| 2002/0192369 | A1* | 12/2002 | Morimoto | C23C 16/14 427/248.1 |
| 2008/0017116 | A1 | 1/2008 | Campbell et al. | |
| 2008/0095936 | A1* | 4/2008 | Senda | C23C 16/45523 427/255.5 |
| 2010/0159694 | A1* | 6/2010 | Chandrashekar | C23C 16/0281 438/660 |
| 2012/0199887 | A1* | 8/2012 | Chan | C23C 16/0281 257/288 |
| 2012/0208300 | A1 | 8/2012 | Cheshire et al. | |
| 2012/0266984 | A1 | 10/2012 | Josephson et al. | |
| 2014/0073135 | A1* | 3/2014 | Guan | C23C 16/14 438/680 |
| 2014/0326185 | A1* | 11/2014 | Lau | C23C 16/45563 118/728 |
| 2015/0047566 | A1* | 2/2015 | Sanchez | C30B 29/06 118/725 |
| 2015/0176123 | A1* | 6/2015 | Carlson | C23C 16/4404 118/715 |

* cited by examiner

APPARATUS FOR IMPURITY LAYERED EPITAXY

CROSS-REFERENCE TO RELATED APPLICATIONS

This application claims benefit of U.S. provisional patent application Ser. No. 61/867,385, filed Aug. 19, 2013, which is herein incorporated by reference.

BACKGROUND

Field

Embodiments of the present disclosure generally relate to fast switching valves for use in a substrate processing chamber.

Description of the Related Art

Epitaxial growth of high-quality silicon-containing films such as silicon germanium (SiGe), silicon germanium carbon (SiGeC), silicon carbide (SiC), or germanium carbide (GeC) films doped with one monolayer or sub-monolayer of impurities often needs repeatable dose of the impurity between the epitaxial layers and from deposition to deposition. Such a deposition process often involves long purges after deposition of each epitaxial layer and after each impurity dose, making the deposition process slow and not production compatible.

Since chamber design directly impacts the film quality in epitaxy growth, there is a need for a deposition apparatus which provides fast dosing capability of sub-monolayer of impurities and purging between epitaxial deposition and impurity dose.

SUMMARY OF THE DISCLOSURE

Embodiments of the disclosure described herein generally relate to fast switching valves for use in a substrate processing chamber. In one embodiment, an apparatus for processing a semiconductor substrate is provided. The apparatus includes a process chamber which includes a substrate support disposed within the process chamber for supporting a substrate, a lower dome and an upper dome opposing the lower dome, a plurality of gas injects disposed within a sidewall of the process chamber, the plurality of gas injects are configured in a substantial linear arrangement corresponding to a diameter of the substrate. The apparatus also includes a gas delivery system coupled to the process chamber via the plurality of gas injects, the gas delivery system includes a gas conduit configured to provide one or more chemical species to the plurality of gas injects via a first fluid line, a dopant source configured to provide one or more dopants to the plurality of gas injects via a second fluid line, and a fast switching valve disposed between the second fluid line and the process chamber, wherein the fast switching valve is configured to switch flowing of the one or more dopants between the process chamber and an exhaust.

In another embodiment, a process chamber for processing a substrate is provided. The process chamber includes a rotatable substrate support disposed within the process chamber for supporting a substrate, a lower dome disposed relatively below the substrate support, an upper dome disposed relatively above the substrate support, the upper dome being opposed to the lower dome, a ring body disposed between the upper dome and the lower dome, wherein the upper dome, the ring body, and the lower dome generally defining an internal volume of the substrate processing chamber, the ring body having a plurality of gas injects arranged in at least one linear group having a width generally corresponding to a diameter of the substrate, a gas delivery system coupled to the process chamber via the plurality of gas injects, the gas delivery system comprising a first gas conduit configured to provide a first set of chemical species to the plurality of gas injects via a first fluid line, a first dopant source configured to provide first dopants to the plurality of gas injects via a second fluid line, and a fast switching valve disposed between the second fluid line and the process chamber, wherein the fast switching valve is configured to switch flowing of the first dopants between the process chamber and an exhaust.

In yet another embodiment, the apparatus includes a process chamber which includes a substrate support having a substrate receiving surface for supporting a substrate, a lower dome disposed relatively below the substrate support, the lower dome comprising a stem portion, a peripheral flange, and a bottom radially extended to connect the stem portion and the peripheral flange, wherein the bottom is at an angle of about 8° to about 16° with respect to the substrate receiving surface of the substrate support, an upper dome disposed relatively above the substrate support, the upper dome being opposed to the lower dome, the upper dome comprising a central window portion, and a peripheral flange for supporting the central window portion, the peripheral flange engages the central window portion around a circumference of the central window portion, wherein the central window portion forms an angle of about 8° to about 16° with respect to the substrate receiving surface of the substrate support, and an array of lamps disposed adjacent to and beneath the lower dome. The apparatus also includes a gas delivery system coupled to the process chamber via the plurality of gas injects, the gas delivery system comprising a gas conduit configured to provide one or more chemical species to the plurality of gas injects via a first fluid line, a dopant source configured to provide one or more dopants to the plurality of gas injects via a second fluid line, and a fast switching valve disposed between the second fluid line and the process chamber, wherein the fast switching valve is configured to switch flowing of the one or more dopants between the process chamber and an exhaust.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the present disclosure. In some instances, well-known structures and devices are shown in block diagram form, rather than in detail, in order to avoid obscuring the present disclosure. These embodiments are described in sufficient detail to enable those skilled in the art to practice the disclosure, and it is to be understood that other embodiments may be utilized and that logical, mechanical, electrical, and other changes may be made without departing from the scope of the present disclosure.

Exemplary Process Chamber

Figure 1A:
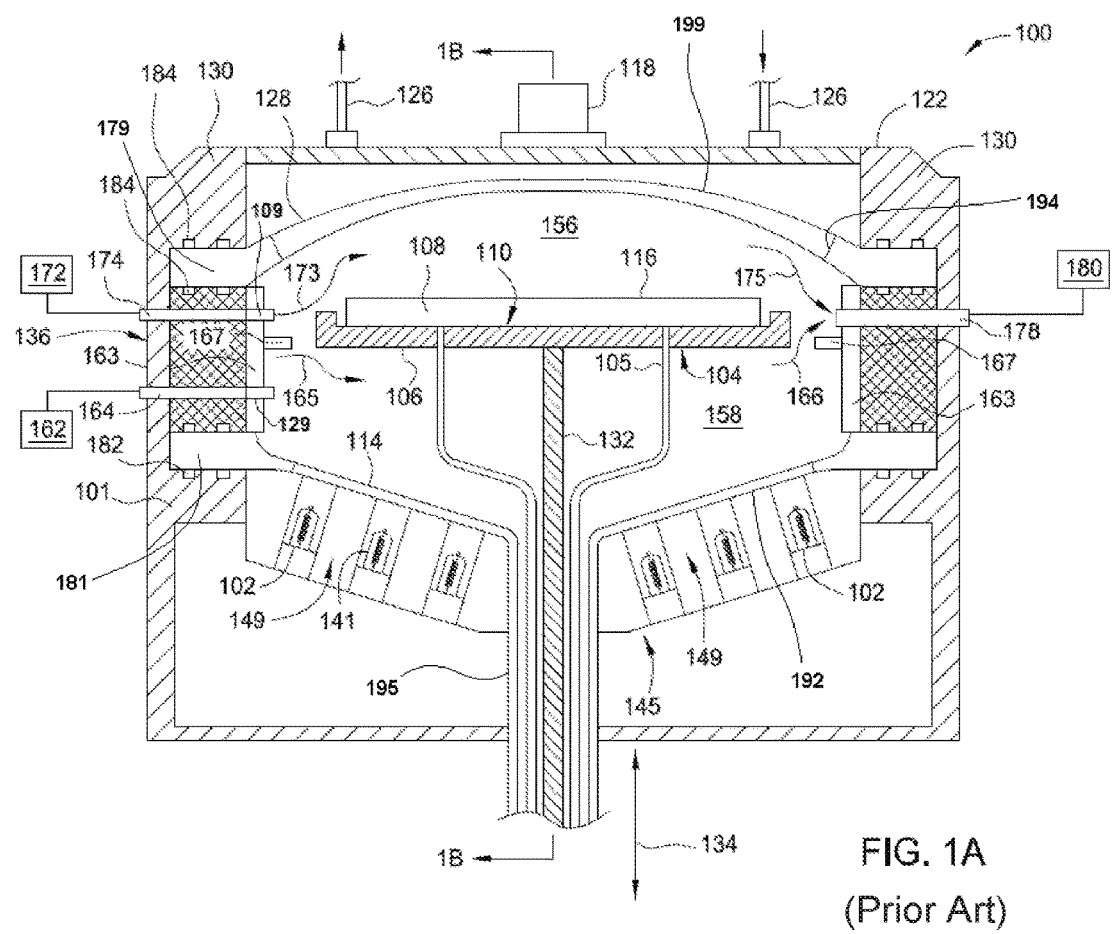
FIG. 1A is a schematic sectional view of a backside heating process chamber according to one embodiment of the disclosure.

FIG. 1A illustrates a schematic sectional view of an exemplary backside heating process chamber 100 according to one embodiment. The process chamber 100 is generally used to process one or more substrates, including epitaxial deposition of a material on an upper surface of a substrate 108. The process chamber 100 may include an array of radiant heating lamps 102 for heating, among other components, a back side 104 of a substrate support 106 disposed within the process chamber 100. In some embodiments, the array of radiant heating lamps may be alternatively or additionally disposed over the upper dome 128. The substrate support 106 may be a disk-like substrate support 106 as shown, or may be a ring-like substrate support 107 with no central opening, which supports the substrate from the edge of the substrate to facilitate exposure of the substrate to the thermal radiation of the lamps 102.

The substrate support 106 is located within the process chamber 100 between an upper dome 128 and a lower dome 114. The upper dome 128, the lower dome 114 and a base ring 136 that is disposed between the upper dome 128 and lower dome 114 generally define an internal region of the process chamber 100. The substrate 108 (not to scale) can be brought into the process chamber 100 and positioned onto the substrate support 106 through a loading port (not shown), which is obscured by the substrate support 106 in FIG. 1A. The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port. The substrate support 106 then may be actuated up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

The upper dome 128 generally includes a central window portion 199 which passes the heat radiations, and a peripheral flange 179 for supporting the central window portion 199. The central window portion 199 may have a generally circular periphery. The peripheral flange 179 engages the central window portion 199 around a circumference of the central window portion 199 along a support interface 194. In one embodiment, the peripheral flange 179 is sealed within the side walls of the process chamber by an O-ring 184 disposed between the peripheral flange 179 and the side walls, to provide seal for preventing the processing gas within the process chamber from escaping into the ambient environment.

The lower dome 114 generally includes a stem portion 195, a peripheral flange 181, and a bottom 192 radially extended to connect the stem portion 195 and the peripheral flange 181. The peripheral flange 181 is configured to surround a circumference of the bottom 192. The peripheral flange 181 and the bottom 192, when combined with the upper dome 128 and the base ring 136, generally define an internal volume of the process chamber 100. In general, the central window portion 199 of the upper dome 128 and the bottom 192 of the lower dome 114 are formed from an optically transparent material such as quartz. The thickness and the degree of curvature of the upper dome 128 and the lower dome 114 may be configured to provide a flatter geometry for uniform flow uniformity in the process chamber. For example, the central window portion 199 of the upper dome 128 may form an angle of about 8° to about 16° with respect to a horizontal plane defining a substrate receiving surface of the substrate support 106. Similarly, the bottom 192 of the lower dome 114 may be at an angle of about 8° to about 16° with respect to a horizontal plane defining a substrate receiving surface of the substrate support 106.

One or more lamps, such as an array of lamps 102, can be disposed adjacent to and beneath the lower dome 114 in a specified, optimal desired manner around the central shaft 132 to independently control the temperature at various regions of the substrate 108 as the process gas passes over, facilitating the deposition of a material onto the upper surface of the substrate 108. The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 114 due in part to the close proximity of the lamphead 145 to the lower dome 114. The lamphead 145 may also cool the lamp walls and walls of the reflectors (not shown) around the lamps. Alternatively, the lower dome 114 may be cooled by a convective approach known in the industry. Depending upon the application, the lampheads 145 may or may not be in contact with the lower dome 114.

A circular shield 167 may be optionally disposed around the substrate support 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The base ring 136 may have a ring body sized to be received within an inner circumference of the processing chamber 100. The ring body may have a generally oblong shape with the long side on the substrate loading port (which is obscured by the substrate support 106) and the short sides on the process gas inlet 174 and the gas outlet 178, respectively. The substrate loading port, the process gas inlet 174 and the gas outlet 178 may be angularly offset at about 90° with respect to each other. The inner circumference of the base ring 136 is configured to receive the liner assembly 163. That is, the liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume.

While the liner assembly 163 is shown as a single body, the liner assembly 163 may include one or more liners. The liner assembly 163 may include a plurality of gas passages 109 in fluid communication with the process gas inlet 174 and the process gas supply source 172 for injecting one or more processing gases to the process gas region 156. The liner assembly 163 may also include a plurality of gas passages 129 for injection one or more gases to the purge gas region 158.

As a result of backside heating of the substrate 108 from the substrate support 106, the use of an optical pyrometer 118 for temperature measurements/control on the substrate support can be performed. This temperature measurement by the optical pyrometer 118 may also be done on substrate device side 116 having an unknown emissivity since heating the substrate front side 110 in this manner is emissivity independent. As a result, the optical pyrometer 118 can only sense radiation from the hot substrate 108 that conducts from the substrate support 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more machined channels 126 connected to a cooling source (not shown). The channel 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

Process gas(es) supplied from a gas delivery system (e.g., the gas delivery system 200 of FIG. 2) is introduced to a process gas supply source 172 and into the process gas region 156 through a process gas inlet 174 disposed in the sidewall of the base ring 136. The process gas inlet 174 may include one or more gas injects 196 (FIG. 1B) for delivering one or more individual gas flows. The process gas inlet 174 may be configured to provide individual gas flows with varied parameters, such as velocity, density, or composition.

In one embodiment, the process gas supply source 172 is configured such that a first set of gas injects 196 provides a process gas that is different than a second set of gas injects 196. Each of the one or more gas injects 196 of the process gas inlet 174 is connected one of the plurality of gas passages 109 formed through the liner assembly 163. As can be better seen in FIG. 1B, the gas injects 196 is distributed along a portion of the liner assembly 163 (and thus the base ring 136) to provide a gas flow that is wide enough to substantially cover the diameter of the substrate. For example, the gas injects 196 may be arranged to the extent possible in at least one linear group generally corresponding to the diameter of the substrate 108. The plurality of gas passages 109 is configured to direct the process gas in a generally radially inward direction. Each of the plurality of gas passages 109 may be used to adjust one or more parameters, such as velocity, density, direction and location, of the process gas from the process gas inlet 174. The plurality of gas passages 109 tune the one or more process gas from the process gas inlet 174 before directing the one pr more process gas to the process gas region 156 for processing.

During process, the substrate support 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 100 opposite the process gas inlet 174. Removal of the process gas through the gas outlet 178 may be facilitated by an exhaust system 180 coupled thereto. As the process gas inlet 174 and the gas outlet 178 are aligned to each other and disposed approximately at the same elevation, it is believed that such a parallel arrangement, when combing with a flatter upper dome 128, will enable a generally planar, uniform gas flow across the substrate 108. Further radial uniformity may be provided by the rotation of the substrate 108 through the substrate support 106.

Similarly, purge gas may be supplied from a gas delivery system (e.g., the gas delivery system 200 of FIG. 2) to a purge gas source 162 and into the purge gas region 158 through an optional purge gas inlet 164 or through the process gas inlet 174 disposed in the sidewall of the base ring 136 through the plurality of gas passages 129 formed in the liner assembly 163. The purge gas inlet 164 is disposed at an elevation below the process gas inlet 174. In another embodiment, the purge gas may be flowed through the process gas inlet 174. If the circular shield 167 or a pre-heat ring (not shown) is used, the circular shield or the pre-heat ring may be disposed between the process gas inlet 174 and the purge gas inlet 164. In either case, the purge gas inlet 164 is configured to direct the purge gas in a generally radially inward direction. During the film formation process, the substrate support 106 may be located at a position such that the purge gas flows down and round along flow path 165 across back side 104 of the substrate support 106 in a laminar flow fashion. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178, which is located on the side of the process chamber 100 opposite the purge gas inlet 164.

Similarly, during the purging process the substrate support 106 may be located in an elevated position to allow the purge gas to flow laterally across the back side 104 of the substrate support 106.

Figure 1B:
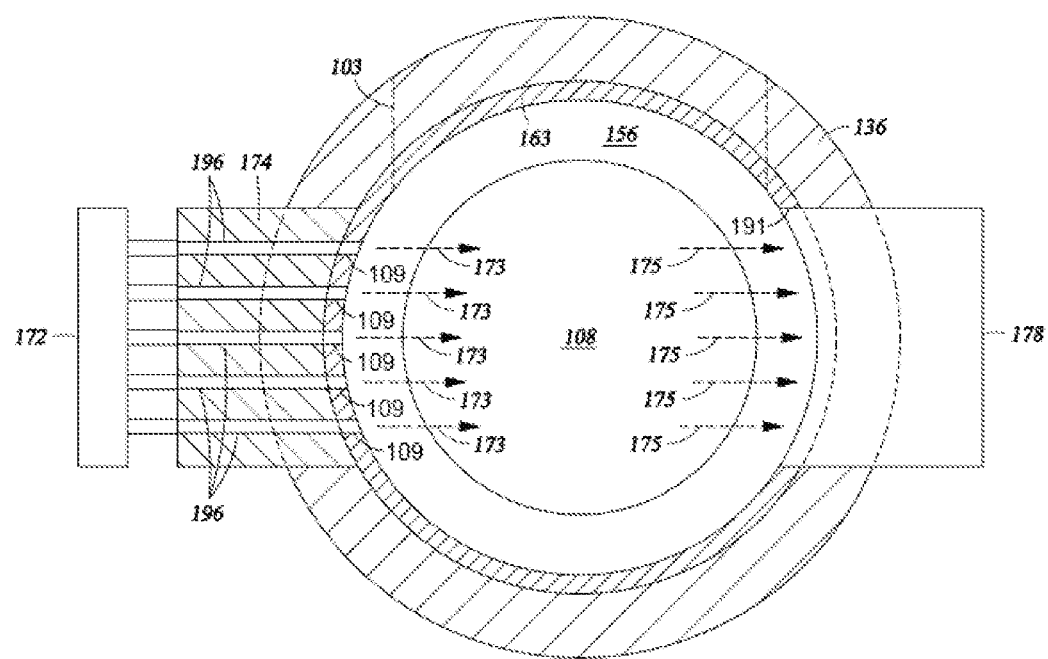
FIG. 1B is a schematic sectional top view of the process chamber of FIG. 1A.

FIG. 1B is a schematic sectional top view of the processing chamber 100 showing the flow paths from the process gas inlet 174 to the gas outlet 178. The plurality of gas passages 109 is in fluid communication with the process gas supply source 172 and is configured to inject one or more processing gases to the process gas region 156. The plurality of gas passages 109 may be distributed around the inner circumference of the process chamber 100 to direct the flow paths 173 in a substantially laminar flow fashion crossing above the substrate 108. In one example, the plurality of gas passages 109 is distributed along a portion of the liner assembly 163 to provide a gas flow that is wide enough to substantially cover the diameter of the substrate 108. The number, dimension and location of the each of the gas passages 109 may be arranged according to achieve a target flow pattern. The exhaust opening 191 may be a wide opening formed through the liner assembly 163 on the opposite side of the plurality of gas passages 109.

It should be appreciated by those of ordinary skill in the art that the plurality of gas passages 109, 129 are shown for illustrative purpose, since the position, size, or number of gas inlets or outlet etc. may be adjusted to further facilitate a uniform deposition of material on the substrate 108.

Exemplary Gas Delivery System

Figure 2:
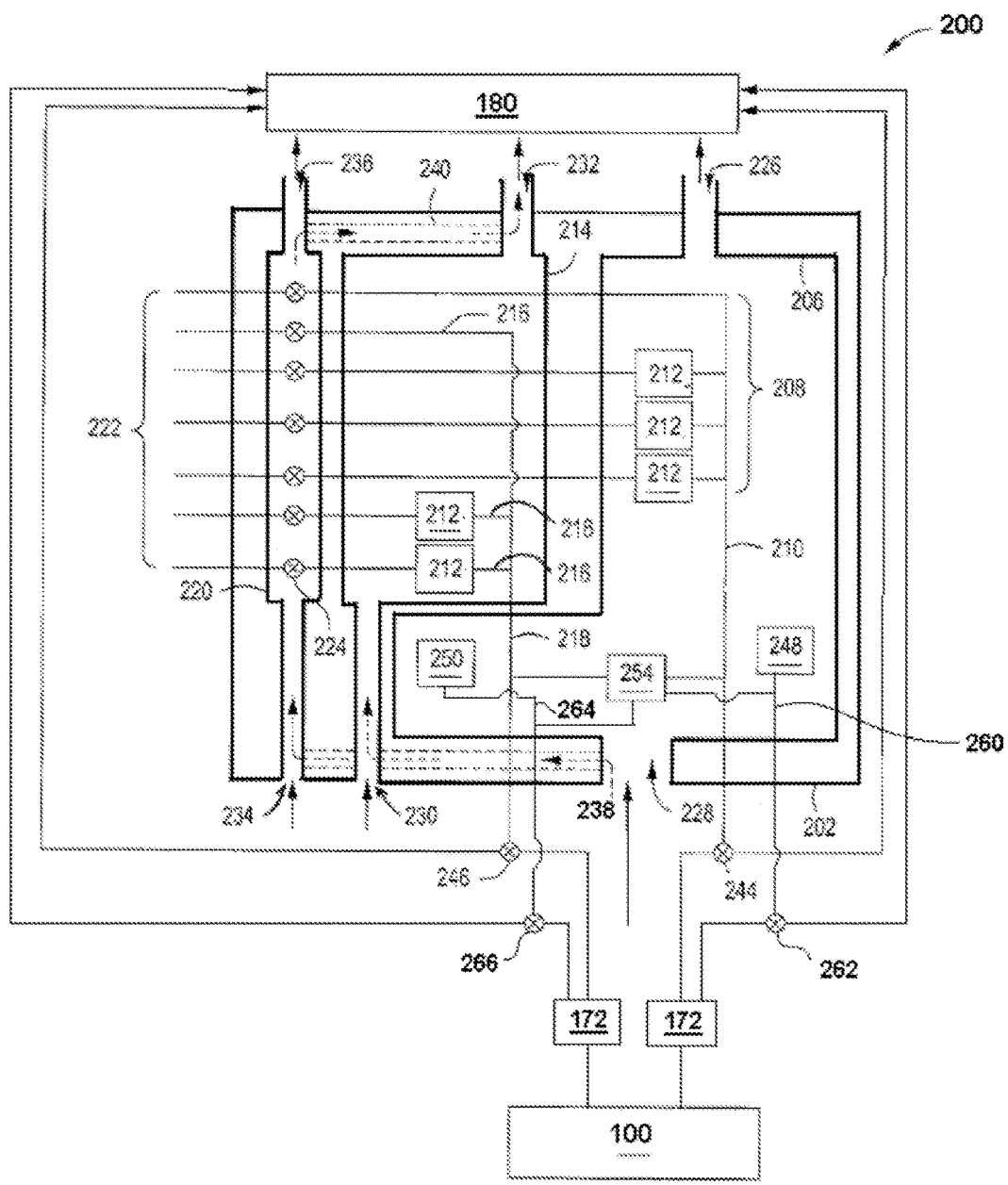
FIG. 2 depicts an exemplary gas delivery system according to one embodiment of the disclosure.

FIG. 2 depicts an exemplary gas delivery system 200 that may be configured to couple to a process gas supply source and a purge gas supply source, respectively, such as the process gas supply source 172 and the purge gas source 162 of FIG. 1A, according to one embodiment of the disclosure. The gas delivery system may include an enclosure 202. The enclosure 202 may serve to house and/or route chemical species. For example, the chemical species may be routed through the enclosure 202 from an external source, such as a central facilities source or any suitable gas source to the process chamber 100 of FIG. 1A. Alternatively or additionally, the chemical species may be housed in the enclosure 202, such as in a liquid and/or solid state, which may be vaporized and/or sublimed and routed to the process chamber 100 of FIG. 1A.

The enclosure 202 may be made of any suitable materials compatible with the chemical species. Such materials may include stainless steel, enamel painted steel, or the like. The enclosure 202 may be partially enclosed, for example having openings or the like that expose at least portions of an interior of the enclosure 202 to the surrounding environment. Elements such as gas conduits or the like can enter and exit the enclosure 202 through such openings. In some embodiments, such openings may be utilized to draw in atmosphere from the surrounding environment for use as a purge gas through the enclosure 202 as discussed below.

The enclosure 202 may include a first compartment 206 disposed within the enclosure 202. In some embodiments, the first compartment 206 may include a plurality of first conduits 208 to carry a first set of chemical species. The plurality of first conduits 208 may originate elsewhere in the enclosure 202, such as in a third compartment 220 and carry at least some of the first set of chemical species to the first compartment 206. In the first compartment 206, each of the first conduits 208 may be coupled to a first fluid line 210 via one or more source devices 212. The source devices 212 may include one or more of a metering device, such as a mass flow controller or the like, a liquid gas injection apparatus, or an ampoule including one or more chemical species from the first set in a liquid or solid state.

The first set of chemical species may be delivered to the first compartment 206 via the plurality of first conduits 208, and/or the first set of chemical species can originate in the first compartment 206. For example, in some embodiments, one of the first set of chemical species may be disposed in a liquid or solid state in the one or more source devices 212, such as an ampoule, and another of the first set of chemical species, such as a carrier gas, provided by one of the plurality of first conduits 208 may pass through the ampoule drawing sublimed or vaporized chemical species from the ampoule into the first conduit 208 and towards the first fluid line 210. The first set of chemical species may include chemical species in solid, liquid or gaseous states. In some embodiments, the first set of chemical species may include a carrier gas, such as hydrogen ($H_2$), nitrogen ($N_2$), argon (Ar), helium (He), or the like. In some embodiments, the first set of chemical species may include one or more Group III elements, which may include trimethyl indium (($CH_3)_3$In) (TMI), trimethyl aluminum ((($CH_3)_3$Al) (TMA), trimethyl gallium (($CH_3)_3$Ga) (TMG), triethyl gallium (($CH_3CH_2)_3$Ga), or the like. In some embodiments, the first set of chemical species may be substantially non-toxic. Accordingly, the first compartment 206 may include a lower draw velocity of a purge gas through the first compartment 206 than that through second and/or third compartments 214, 220 as discussed below.

The enclosure 202 may include a second compartment 214 disposed within the enclosure 202. In some embodiments, the second compartment 214 may be isolated with respect to the first compartment 206. However, this is merely an exemplary illustration and other embodiments are possible. For example, the first and second compartments 206, 214 may be open to each other (not shown). In some embodiments, the second compartment 214 may include a plurality of second conduits 216 to carry a second set of chemical species. The plurality of second conduits 216 may originate elsewhere in the enclosure 202, such as in a third compartment 220 and carry at least some of the second set of chemical species to the second compartment 214. In the second compartment 214, each of the second conduits 216 may be coupled to a second fluid line 218 via the one or more source devices 212.

The second set of chemical species may be delivered to the second compartment 214 via the plurality of second conduits 216, and/or the second set of chemical species can originate in the second compartment 216 in a substantially similar manner to embodiments discussed above regarding the first set of chemical species. The second set of chemical species may include chemical species in solid, liquid or gaseous states. In some embodiments, the second set of chemical species may include a carrier gas, such as hydrogen ($H_2$), nitrogen ($N_2$), argon (Ar), helium (He), or the like. In some embodiments, the second set of chemical species may include one or more Group V elements. For example, chemical species comprising Group V elements may include phosphine ($PH_3$), arsine ($AsH_3$), tertiarybutyl phosphine (($CH_3)_3$C)$PH_2$), tertiarybutyl arsine (($CH_3)_3$C)$AsH_2$), trimethyl antimony (($CH_3)_3$Sb), or the like. In some embodiments, the second set of chemical species may be different from the first set of chemical species.

The enclosure 202 may include a third compartment 220. The third compartment 220 may receive at least some chemical species from the first or second sets of chemical species from a location external to the enclosure 202. For example, the at least some chemical species may be provided to the third compartment by one or more gases sources, for example from central facility sources or from gas sources specifically provided for use with the process chamber 100. For example, the at least some chemical species may be provided to the third compartment 220 by a plurality of third conduits 222. Each third conduit may enter the enclosure 202 from an external location and carry a chemical species from the first or second sets. At least some of the first and second conduits 208, 216 may be coupled in the third compartment 220 to other conduits disposed primarily external to the enclosure to carry the at least some chemical species respectively to the first and second compartments 206, 214. Similar to the first and second compartments 206, 214, the third compartment 220 can be an isolated compartment, or a predominantly isolated compartment that is partially open to the first and second compartments 206, 214.

The third compartment 220 may include a plurality of joints 224 disposed within the third compartment 220. Each joint 224 may couple one of the plurality of third conduits 222 to a corresponding one of the plurality of first and second conduits 208, 216. Each joint 224 may be one or more of a valve, connector, or the like.

The first, second and third compartments 206, 214, 220 may be maintained under a continuous purge gas flow during operation of the process chamber and/or at all times. The purge gas may be an inert gas, such as Ar, He or the like, and fed into each of the first, second, and third compartments 206, 214, 220. Alternatively or additionally, the purge gas may be the surrounding atmosphere, drawn into the enclosure 202 and through the compartments 206, 214,220 by an exhaust system or the like coupled to the compartments 206, 214, 220.

Each of the first, second and third compartments may have separate exhaust openings and draw openings for the net and outlet of the purge gas through each of the compartments. Alternatively, the one or more of the exhaust openings and/or draw openings may be shared between compartments. For example, in some embodiments, the first compartment 206 may include a first exhaust outlet 226 to exhaust a purge gas flowing through the first compartment 206. In some embodiments, the first compartment 206 may include a first draw opening 228 to draw the purge gas into the first compartment 206. In some embodiments, the second compartment 214 may include a second exhaust outlet 232 to exhaust the purge gas flowing through the second compartment 214. In some embodiments, the second compartment 214 may include a second draw opening 230 to draw the purge gas into the second compartment 214. In some embodiments, the third compartment 220 may include a third exhaust outlet 236 to exhaust the purge gas flowing through the third compartment 220. In some embodiments, the third compartment 220 may include a third draw opening 234 to draw the purge gas into the third compartment 220.

Alternative embodiments of openings for inlet and outlet of the purge gas are possible for the first, second, and third compartments 206, 214, 220. For example, the first, second and third draw openings 228, 230, and 234 may be replaced by a single draw opening, for example such as the first draw opening 228 having a conduit 238 coupling the first draw opening 228 to the second and third compartments 214, 220. Alternatively, bottom portions (not shown) of the enclosure 202 and each of the first, second, and third compartments 206, 214, 220 may be open and/or having openings disposed proximate thereto, for example, such as in side portions of the enclosure 202 or the like for drawing in the purge gas. It is contemplated that any one or more of the compartments may have multiple draw openings and/or exhaust openings.

Similarly, in some embodiments, the second and third gas compartments 214, 220 may have substantially similar purge gas draw requirements. Accordingly, the second and third exhaust outlets 232, 236 may be a single exhaust opening, for example, illustrated as a conduit 240 coupling the third compartment 220 to the second exhaust outlet 232. However, this is merely an illustratively example, and other variants of a single exhaust opening for the second and third compartments 214,220 may be possible.

Each of the first, second and third compartments 206, 214, 220 may have varying purge gas draw requirements, for example, to pass a gas tracer test or the like. For example, the first compartment 206 which routes the first set of chemical species may have a lower purge gas draw requirement than the second or third compartments 214, 220. In some embodiments, the first compartment 206 may have a lower purge gas draw requirement when the first set of chemical species are substantially non-toxic materials, such as materials including Group III elements.

For example, the second compartment 214 which routes the second set of chemical species and/or the third compartment 220 which routes both the first and second set of chemical species may have higher purge gas draw requirements than the first compartment 206. In some embodiments, the second and/or the third compartments 214, 220 may have a higher purge gas draw requirement when the second set of chemical species include toxic materials, such as materials including Group V elements. In some embodiments, the draw velocity of the purge gas through the second compartment 214 is higher draw than the draw velocity of the purge gas through the first compartment 206. In some embodiments, the draw velocity of the purge gas through the third compartment 220 is higher than the draw velocity of the purge gas through the first compartment 206.

Variation of the draw velocity of the purge gas in each compartment may be achieved by one or more embodiments of the present disclosure. For example, each compartment may have a different volume. In addition, each exhaust outlet 226, 232, 236 may be coupled to a different exhaust system (not shown), where each exhaust system has a different exhaust rate. Alternatively, each exhaust outlet 226, 232, 236 may be coupled to the same exhaust system 180. In some embodiments, variation of draw velocity of the purge gas in each compartment 206, 214, 220 may be controlled by controlling the diameter of each exhaust outlet 226, 232, 236. For example, in some embodiments, to achieve a higher draw velocity in the second compartment 214, the second exhaust outlet 232 may be smaller than the first exhaust outlet 226 of the first compartment 206. Similarly, in some embodiments, to achieve a higher draw velocity in the third compartment 220, the third exhaust outlet 236 may be smaller than the first exhaust outlet 226 of the first compartment 206. Any suitable combination of compartment volumes, exhaust opening diameters, and upstream pressure control can be utilized to control the draw velocity and/or volume requirements for the first, second, and/or third compartments 206, 214, 220.

The gas delivery system 200 may include a first switching valve 244 disposed between the first fluid line 210 and the process chamber 100. The first switching valve 244 may switch between flowing one or more chemical species from the source devices 212 to the process chamber 100 and to the exhaust system 180. The gas delivery system 200 may also include a second switching valve 246 disposed between the second fluid line 218 and the process chamber 100. The second switching valve 246 may switch between flowing one or more chemical species from the second set to the process chamber 100 and to the exhaust system 180. A process controller (not shown) may be coupled to the first and second fluid lines 210, 218, to facilitate closed loop controlled back pressure, for example, to limit pressure perturbations resultant from switching between the deposition lines flowing to the process chamber 100 and the exhaust lines flowing to the exhaust system 180 via the switching valves 244, 246. In some embodiments, the deposition lines, exhaust lines, and/or fluid lines 210, 218 may be continuously swept (e.g., may have a continuous flow of a non-reactive gas) to limit and/or prevent back streaming of chemical species in a particular line. For example, sweeps of each line may be performed using a non-reactive gas, such as a carrier gas, an inert gas, or the like, such as $H_2$ or other such gases. Gases used for sweeping each line may be provided using any of the apparatus discussed above, such as via ones of the pluralities of first, second, and/or third conduits 208, 216, 222, or alternatively via one or more designated conduits (not shown) coupled to each line which is to be swept.

Each of the first and second switching valves 244, 246 may be configured to provide fast switching ability to allow for fast switching between supplying different process gases to the process chamber 100 without incurring (or while minimizing any) pressure perturbations in the gas supply to the process chamber 100 that may negatively impact processing, such as deposition uniformity. The first and second switching valves 244, 246 may be configured to provide chemical species from the source device 212 to the process gas supply source 172, and subsequently into the process chamber 100 through one or more gas injects 196 of the process gas inlet 174 shown in FIG. 1B.

The gas delivery system 200 may include a first dopant source 248 coupled to a third fluid line 260. The first dopant source 248 may be disposed in the first compartment 206, or alternatively may be routed through the first compartment via one or more conduits (not shown) from external supply source, such as by similar apparatus as discussed above for routing chemical species from the first and second sets from external supply sources. The first dopant source 248 may provide one or more first dopants in liquid or gaseous form to the third fluid line 260. The third fluid line 260 is coupled to a third switching valve 262, which switches between flowing the first dopants from the first dopant source 248 to the process chamber 100 and to the exhaust system 180. The one or more first dopants may be suitable for doping the material formed by the reaction of Group III elements with Group V elements. Exemplary first dopants may include silane ($SiH_4$), germane ($GeH_4$), n-type dopants, or any other desired dopants.

The gas delivery system 200 may optionally include a second dopant source 250 coupled to the fourth fluid line 264. The second dopant source 250 may be disposed in the first compartment 206, or alternatively may be routed through the first compartment via one or more conduits (not shown) from external supply source, such as by similar apparatus as discussed above for routing chemical species from the first and second sets from external supply sources. The second dopant source 250 may provide one or more second dopants in liquid or gaseous form to the fourth fluid line 264. The fourth fluid line 264 is coupled to a fourth switching valve 266, which switches between flowing the second dopants from the second dopant source 250 to the process chamber 100 and to the exhaust system 180. The one or more second dopants may be suitable for doping the material formed by the reaction of Group III elements with Group V elements. Exemplary second dopants may include bromotrichloromethane ($CCl_3Br$), p-type dopants, or any other desired dopants.

The first and/or the second dopant source 248, 250 may additionally provide a dilution gas to flow with the dopants. The dilution gas may be an easily ionized, relatively massive, and chemically inert gas such as argon, krypton, or xenon. Alternatively or additionally, hydrogen gas may be used in some cases. The dilution gas may have a volumetric flow rate to the dopant volumetric flow rate ratio of about 1:1 to about 20:1, for example about 2:1 to about 4:1, about 4:1 to about 6:1, about 6:1 to about 8:1, about 8:1 to about 10:1, about 10:1 to about 12:1, about 12:1 to about 14:1, about 14:1 to about 16:1, about 16:1 to about 18:1, about 18:1 to about 20:1.

In certain embodiments, the first, second, third and fourth switching valves 244, 246, 262, 266 may be positioned very close or right at the injection location adjacent to the side of the process chamber 100. For example, the switching valves 244, 246, 262, 266 may be positioned adjacent to the process gas supply source 172. The third and/or fourth switching valves 262, 266 for first and second dopant sources 248, 250 may be a fast switching valve which can be independently operated to selectively open to divert dopants to the process chamber 100 or the exhaust system 180. The third and/or fourth switching valves 262, 266 may be configured to provide a short pulsed dosing of the first dopants and second dopants to the process gas supply source 172, for example, to the one or more gas injects 196 of the process gas inlet 174 shown in FIG. 1B. The term "fast-switching valve" described herein refers to a valve that is adjustable within a relatively short time between the two extreme control positions. Such a quick-acting valve between a control position of maximum open flow cross-section, and a control position of minimum open or closed cross-section with switching times of less than 50 ms, or less than 20 ms, or less than 10 ms, or less than 5 ms. The third and fourth switching valves 262, 266 may be each configured to dose the first and second dopants at a pulse repetition rate of about 0.05 seconds to about 20 seconds, such as about 0.1 seconds to about 3.5 seconds, for example about 0.5 seconds to about 1 second. In one example, the third and fourth switching valves 262, 266 may be configured to a short puked dosing of the dopants for about 0.1 seconds to about 2 seconds before and/or during the epitaxial process. In various examples, the time period of the short pulsed dosing should be sufficient to provide one monolayer or sub-monolayer of dopants on the substrate surface, it is contemplated that the time period of the short pulsed dosing or the pulse repetition rate may vary depending upon the application. If desired, the time period of the short pulsed dosing and/or the pulse repetition rate of the third and fourth switching valves 262, 266 may be the substantially same or different from each other. Having the third and fourth switching valves 262, 266 configured as a fast switching valve enables fast and repeatable dosing of dopants, and therefore, ensures epitaxial growth of high-quality films.

The gas delivery system 200 may include a purging gas source 254 coupled to the first, second, third and fourth fluid lines 210, 218, 260, 264. In some embodiments, each of the first, second, third and fourth fluid lines 210, 218, 260, 264 may be coupled to respective purging gas source. The purging gas source 254 may be disposed in the first compartment 206, or alternatively may be routed through the first compartment via one or more conduits (not shown) from external supply source, such as by similar apparatus as discussed above for routing chemical species from the first and second sets from external supply sources. For example, the purging gas source 254 may provide a purging gas that may be utilized to clean the fluid lines 210, 218, 260, 264, the process chamber 204, or other components of the gas delivery system 200. Exemplary cleaning gases may include hydrogen ($H_2$), chlorine ($Cl_2$), hydrogen chloride (HCl), or nitrogen trifluoride ($NF_3$), or chlorine trifluoride ($ClF_3$). In one example, the purging gas may be flowed at a flow rate of about 30 slm to about 50 slm.

Benefits of the disclosure provide a fast pressure control valve to reduced pressure EPI chambers, which may include, among others, gas injection valves disposed at the side of the chamber, and lamp heating elements for fast temperature control. The EPI chambers may have a dedicated manifold for the impurity source injection separate from the epitaxial deposition gases/precursor manifold. The EPI chambers allow for the fast source gas change-out between deposition and impurity dose. The final valves for both the impurity and EPI deposition manifold may be close or right at the injection location adjacent to the side of the substrate. Particularly, the final valve for the impurity manifold is a fast switching valve for short pulsed dosing of sub-monolayer coverage on the substrate surface. In various embodiments, the EPI chambers may provide high carrier purge flow (e.g., 30 slm-50 slm) for fast purging between EPI deposition and impurity dose. Fast temperature control and in-situ chamber clean provide the ability for repeatable dose and temperature profile during impurity dose that could be different from the EPI deposition temperature. In some embodiments, the impurity source may be provided with double dilution. In cases where impurity sources may react with the deposition sources, gas exclusion interlock may be provided.

While the foregoing is directed to embodiments of the present disclosure, other and further embodiments of the disclosure may be devised without departing from the basic scope thereof, and the scope thereof is determined by the claims that follow.

The invention claimed is:

1. An apparatus for processing a semiconductor substrate, comprising:
  an epitaxial process chamber, comprising:
    a substrate support disposed within the process chamber;
    a lower dome disposed relatively below the substrate support;
    an upper dome disposed relatively above the substrate support, the upper dome being opposed to the lower dome; and
    a plurality of gas injects disposed within a sidewall of the process chamber; and
  a gas delivery system coupled to the epitaxial process chamber via the plurality of gas injects, the gas delivery system comprising:
    a gas conduit for providing one or more chemical species to the plurality of gas injects via a first fluid line;
    a dopant source for providing one or more dopants to the plurality of gas injects via a second fluid line; and
    a fast switching valve disposed between the second fluid line and the epitaxial process chamber, wherein the fast switching valve switches flowing of the one or more dopants between the epitaxial process chamber and an exhaust, and wherein the fast switching valve switches flowing of the one or more dopants between the epitaxial process chamber and the exhaust for less than 50 ms.

2. The apparatus of claim 1, wherein the fast switching valve provides a short pulsed dosing of the one or more dopants at a pulse repetition rate of about 0.05 seconds to about 20 seconds.

3. The apparatus of claim 1, further comprising:
  a valve disposed between the first fluid line and the epitaxial process chamber, wherein the valve switches flowing of the one or more chemical species between the epitaxial process chamber and the exhaust.

4. The apparatus of claim 1, wherein the dopant source further provides a dilution gas to the plurality of gas injects via the second fluid line.

5. The apparatus of claim 4, wherein the dilution gas has a volumetric flow rate to the dopant volumetric flow rate ratio of about 1:1 to about 20:1.

6. A process chamber for processing a substrate, comprising:
  a rotatable substrate support disposed within an epitaxial process chamber;
  a lower dome disposed relatively below the substrate support;
  an upper dome disposed relatively above the substrate support, the upper dome being opposed to the lower dome;
  a ring body disposed between the upper dome and the lower dome, wherein the upper dome, the ring body, and the lower dome generally defining an internal volume of the process chamber, the ring body having a plurality of gas injects arranged in at least one linear group; and
  a gas delivery system coupled to the epitaxial process chamber via the plurality of gas injects, the gas delivery system comprising:
    a first fluid line;
    a first gas conduit for providing a first set of chemical species to the plurality of gas injects via the first fluid line;
    a second fluid line;
    a first dopant source for providing first dopants to the plurality of gas injects via the second fluid line; and
    a fast switching valve disposed between the second fluid line and the epitaxial process chamber, wherein the fast switching valve switches flowing of the first dopants between the epitaxial process chamber and an exhaust, and wherein the fast switching valve switches flowing of the first dopants between the epitaxial process chamber and the exhaust for less than 50 ms.

7. The process chamber of claim 6, wherein the fast switching valve provides a short pulsed dosing of the first dopants at a pulse repetition rate of about 0.05 seconds to about 20 seconds.

8. The process chamber of claim 6, wherein the first dopant source provides a dilution gas to the plurality of gas injects via the second fluid line.

9. The process chamber of claim 8, wherein the dilution gas has a volumetric flow rate to the first dopant volumetric flow rate ratio of about 1:1 to about 20:1.

* * * * *